United States Patent [19]

Huelsman

[11] 4,013,968
[45] Mar. 22, 1977

[54] FEEDBACK CONTROLLED STORAGE TUBE DEVICES
[75] Inventor: Kenneth A. Huelsman, Carlsbad, Calif.
[73] Assignee: Hughes Aircraft Company, Culver City, Calif.
[22] Filed: Mar. 14, 1975
[21] Appl. No.: 558,530
[52] U.S. Cl. .............................. 328/124; 313/399; 313/400; 315/374; 328/126; 340/173 CR; 340/324 A
[51] Int. Cl.² ...................................... G11C 11/23
[58] Field of Search ......... 328/121, 123, 124, 126; 340/324 A, 173 CR; 313/68 R, 68 A; 315/21 MR

[56] References Cited
UNITED STATES PATENTS

| | | | |
|---|---|---|---|
| 2,770,756 | 11/1956 | Klein | 328/123 X |
| 2,777,060 | 1/1957 | Waters | 328/124 |
| 2,951,176 | 8/1960 | Williams | 328/123 X |

Primary Examiner—John Zazworsky
Attorney, Agent, or Firm—Lawrence V. Link, Jr.; W. H. MacAllister

[57] ABSTRACT

The combination of a storage tube and a feedback circuit operatively intercoupled such that as data is read from the storage tube the level of stored charge on each incremental area of the dielectric of the tube's target is sensed and the potential between the cathode and target conductor is automatically adjusted as a function of the sensed charge level. This feedback control of the aforementioned potential allows for the use of a larger differential charging range on the target's dielectric, which in turn provides a substantial improvement in the fidelity of data processing through the storage tube.

18 Claims, 15 Drawing Figures

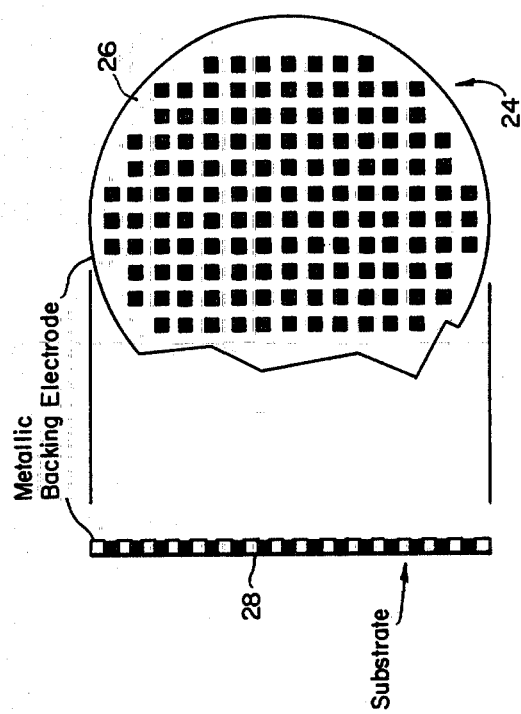
Fig.5
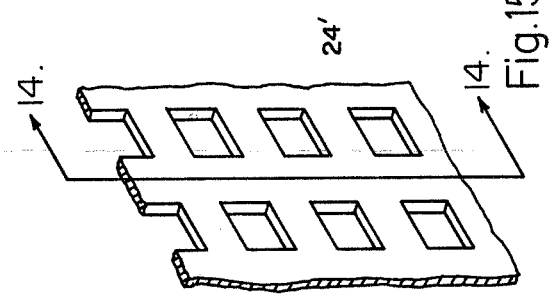
Fig.4
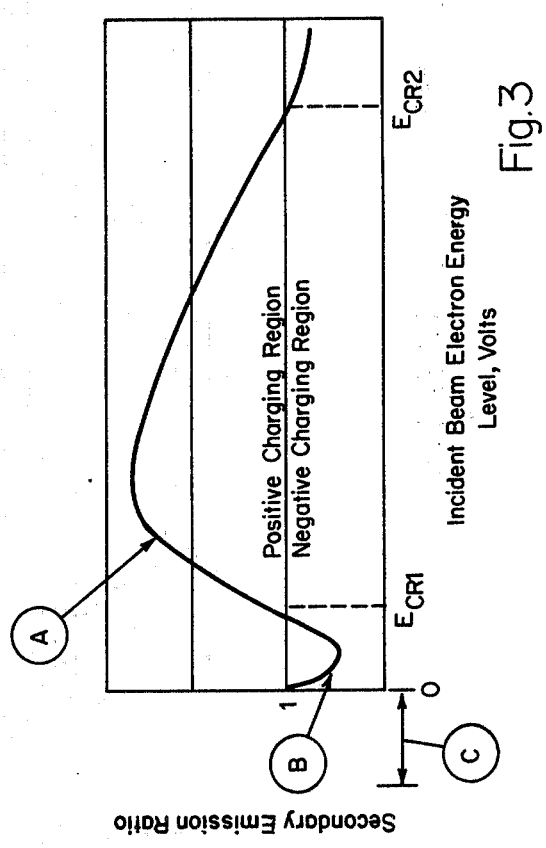
Fig.3
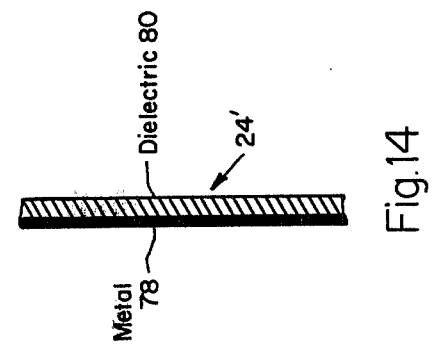
Fig.15
Fig.14

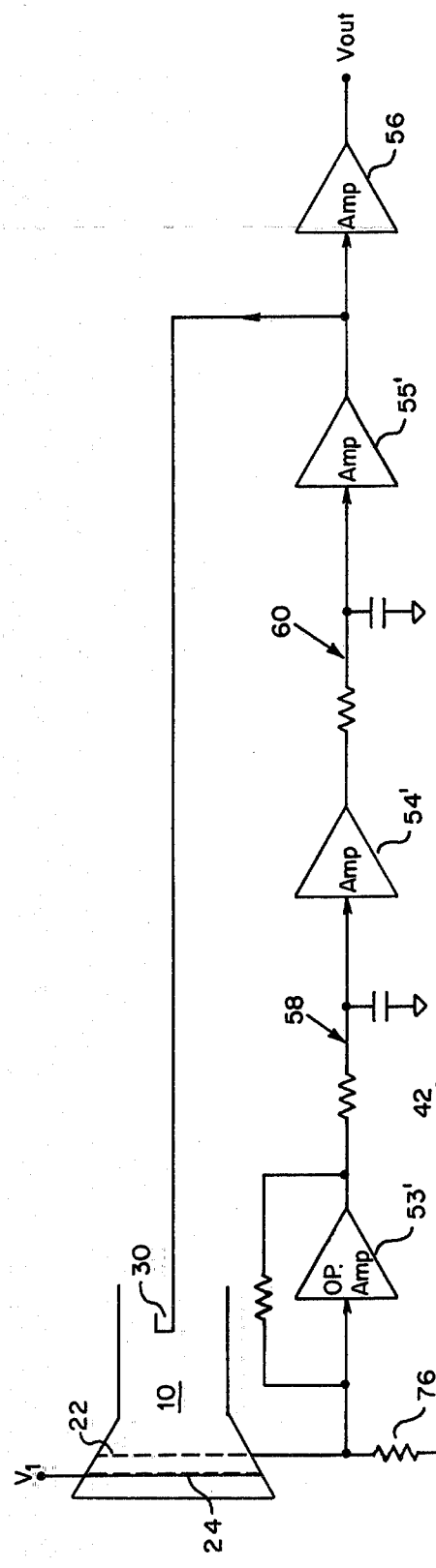
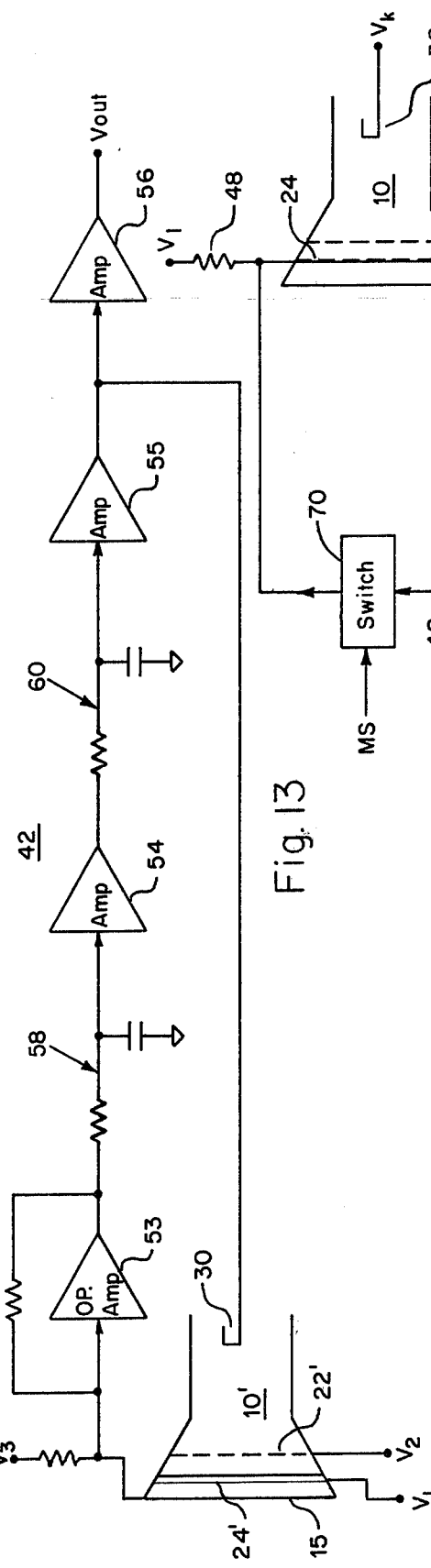
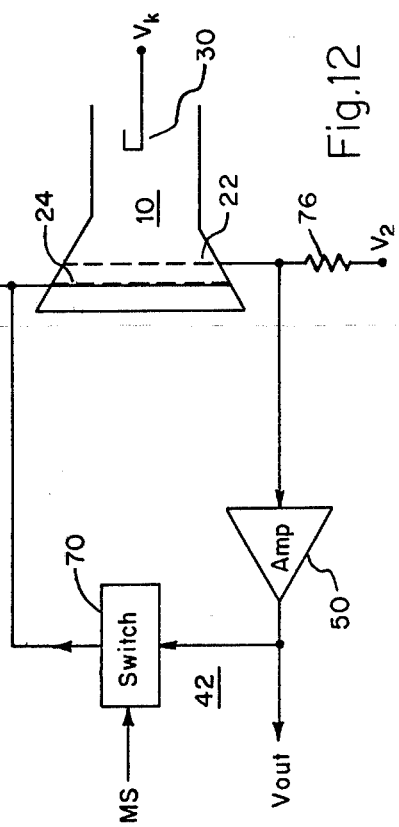
Fig. 11
Fig. 12
Fig. 13

FEEDBACK CONTROLLED STORAGE TUBE DEVICES

BACKGROUND OF THE INVENTION

This invention relates generally to storage tube devices and is particularly advantageous for scan converters used in applications requiring a high degree of fidelity in their data processing operation.

One application of the subject invention relates to scan converter devices wherein information is stored within a storage tube by a scanning electron beam that impresses a charge pattern on the dielectric of a target element; and the stored charge pattern is readout for extended periods of time by means of a read beam. The target structure of the scan converter tube may, for example, comprise coplanar conductive areas and dielectric areas. The conductive areas, which serve as target control elements, also act as the receptor for current during the read mode of operation; which current is amplified to provide the output data signal from the scan converter. The transfer function for the data readout operation of a typical scan converter tube is shown in FIG. 6. For most storage tubes, with a fixed value of cathode-to-target potential, there is only 4 or 5 volts range of dielectric charge between cutoff and saturation of the output current.

In applications requiring high fidelity of data conversion, a major problem restricting the use of storage tube devices is the presence of shading, i.e. nonuniform output for uniform or single valued writing on the target. Such shading is particularly undesirable in display type applications, since it results in all data being imprinted with the "map" of the nonuniform target characteristics. The shading or nonuniformities are caused by a variety of target characteristics and beam landing effects, and could be 20 percent or more. Also, it has been found that if the bias on the target's conductor is set at different levels the shading remains generally the same.

One aspect of the subject invention was recognition of the fact that the shading can be equated to the differential charging of the target during the write mode of operation. For example, for the scan converter tube whose readout transfer characteristics are shown in FIG. 6 and with a typical operating voltage of a +5 volts on the target's conductor, the range of charge stored on the dielectric would be 5 volts over the 5 to 95 percent range of the output current; and so if shading were 20 percent it could be equated to a 1 volt error in the stored charge pattern. Another aspect of the subject invention is recognition of the fact that the value of this shading error is relatively constant and if the target's dielectric were charged over a wider range, for example, 16 volts, the shading would be reduced; for example, to 1 volts out of 16 volts or 6 percent.

Charging the target's dielectric over a 16 volt range instead of the 5 volts normally used, only requires an increase in the intensity of the write beam current and/or an increase in the writing time; and for most storage tubes such an increase in writing range does not present any difficulties. However, readout of a 16 volt charge on the dielectric with a constant potential between the cathode and the target's conductor would result in a large portion of the written information being either in cutoff (the output below 5 percent of full output current) or a saturation (above 95 percent of full output current). A significant aspect of the subject invention is the recognition of the fact that the set of output current ranges for various target conductor-to-cathode voltages and dielectric charge levels, is such that if the target conductor-to-cathode voltage were properly adjusted during data readout a greatly increased range of stored charge could be handled without distortion.

SUMMARY OF THE INVENTION

It is a primary object of the subject invention to provide storage tube devices which are capable of improved performance.

Another object is to provide storage tube devices which exhibit substantially reduced shading.

Another object of the invention is to provide storage tube devices having more linear transfer functions.

A further object of the invention is to provide storage tube devices which are capable of storing data over a longer time period.

Yet another object of the invention is to provide storage tube devices having improved "zoom bleed down" characteristics, i.e. degradation which results from the repetitive reading of the same small area of the target is decreased.

A still further object is to provide storage tube devices having a substantial improvement in the signal-to-noise ratio of the output data therefrom.

Another object of the invention is to provide storage tube devices which exhibit improved overall system stability.

In accordance with the subject invention a storage tube and a feedback circuit are operatively interconnected such that as data is read from the storage tube the level of stored charge on the target's dielectric is sensed and the potential between the tube's cathode and target conductor is automatically adjusted as a function of the sensed charge level. The resultant feedback control of the cathode-to-target conductor potential extends the useful differential charging range of the target's dielectric and provides a substantial improvement in the overall performance of the combination.

In accordance with one preferred embodiment of the invention, the current from the target's conductor is sensed across a resistor in series therewith and the resultant signal is amplified and fed to the cathode of the tube so as to cause the cathode-to-target conductor potential to change during the reading of dielectric areas as a function of the charge stored thereon. It is characteristic of storage tubes that the output current from the target's conductor would normally tend to decrease as the magnitude of the charge being read increases and so from a signal processing point of view the feedback implemented in accordance with the subject invention could be considered as negative feedback, i.e. as the output current from the target conductor tends to decrease the feedback circuit increases the cathode-to-target conductor potential.

In accordance with a second embodiment of the subject invention, the potential of the cathode is held constant and the feedback is implemented by sensing the current from the target conductor, amplifying the sensed signal and applying it back to the target voltage supply circuit with a polarity such that as the target current tends to decrease the bias drive to the target's conductor is increased.

In accordance with a third embodiment of the invention, during the readout mode of operation a very large resistor is switched in series with the target conductor and its source of bias potential, and as the target conductor's current decreases the bias voltage applied thereto increases.

Another embodiment of the invention senses the charge stored on the target's dielectric by monitoring the current from the collector electrode of the tube, instead of the target's conductor, and the sensed signal is fed to cathode or the target's conductor so as to increase the cathode-to-target conductor potential as the charge levels being read from the storage dielectric increases.

BRIEF DESCRIPTION OF THE DRAWINGS

The novel features of this invention, as well as the invention itself, will be best understood from the accompanying description taken in connection with the accompanying drawings, in which like reference characters refer to like parts and in which:

FIG. 3 is a graph of the secondary emission ratio versus the energy level of the incident electron beam for the scan converter tube of FIG. 1;

FIGS. 4 and 5 are side and front views, respectively, of the target of the scan converter tube of FIG. 1;

FIGS. 7 through 12 are block and schematic diagrams of various embodiments of feedback controlled scan converter tubes in accordance with the principles of the subject invention;

FIGS. 13 is a block and schematic diagram of a feedback controlled direct view storage tube in accordance with the invention; and FIGS. 14 and 15 are side and front view, respectively, of a portion of the target of the direct view storage tube shown in FIG. 12, and is useful for explaining the operation thereof.

DETAILED DESCRIPTION OF THE PREFERRED EMBODIMENTS

Figure 1:
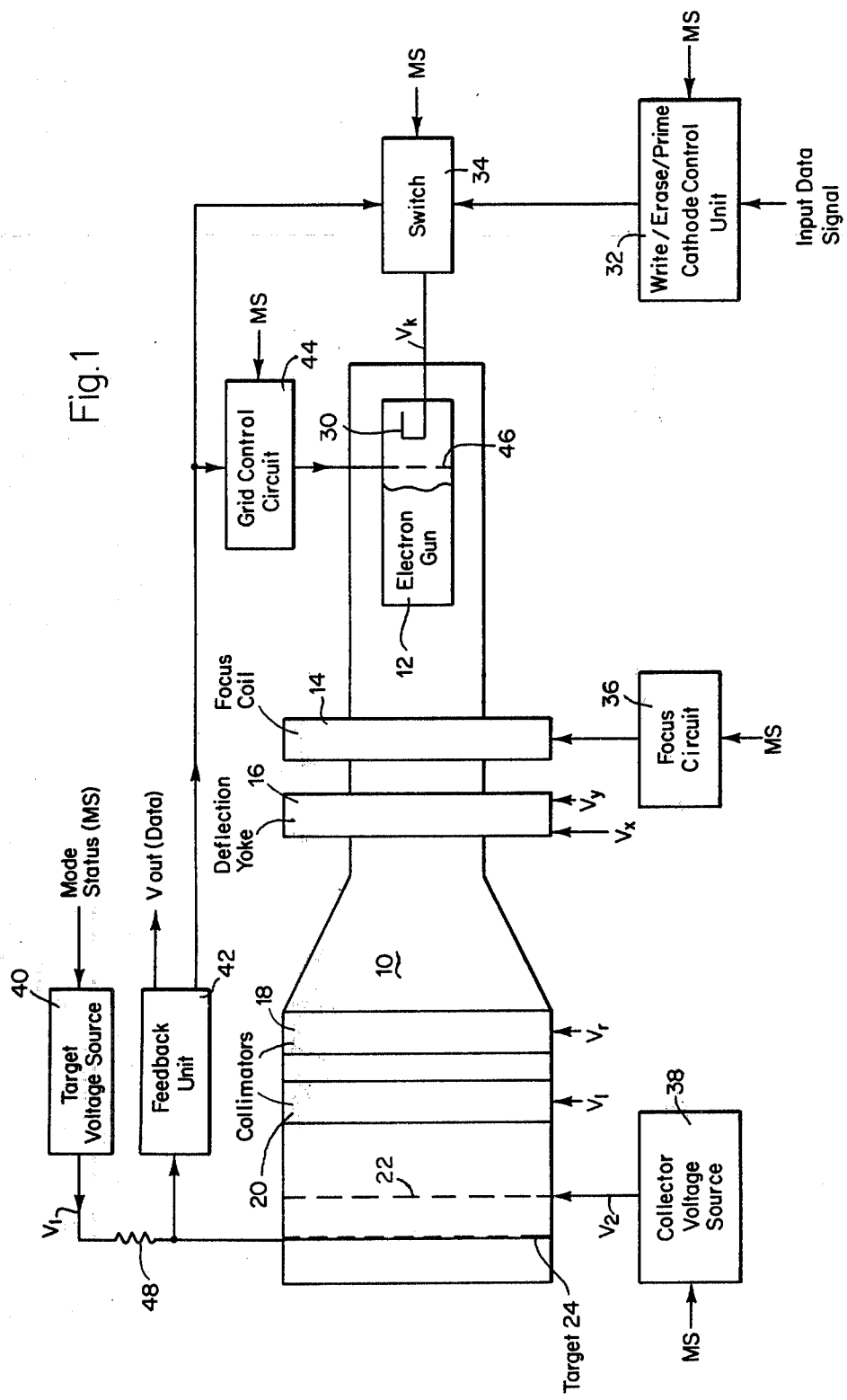
FIG. 1 is a block diagram of a feedback controlled storage tube device incorporating the principles of the subject invention.

Referring first to FIG. 1, storage tube 10 may be, for example, a type H1269A manufactured by the Hughes Aircraft Company, Industrial Products Division of Carlsbad, Calif. The operation of the scan converter tube per se, exclusive of the feedback arrangement included by the subject invention, is well known in the art and is, for example, described in detail in Manual 00816 of the above referenced manufacturer. As shown in FIG. 1, scan converter tube 10 includes an electron gun 12, a focusing element 14, a deflection element 16, collimators 18 and 20 and a collector 22. A target 24 comprises a grid-like, metallic backing electrode 26 (sometimes hereinafter referred to as the target conductor) deposited on an insulator or dielectric substrate 28 (see FIGS. 4 and 5). The dielectric area exposed in each backing electrode opening forms a discrete storage element and collectively all such elements constitute the storage surface.

Operation of scan converter tube 10 is based primarily on the ability of the target's dielectric to charge in a positive or a negative direction, depending on the energy level of the incident electron beam as established by the cathode-to-target dielectric potential. Such a property results from the secondary emission charac- teristics of the target's dielectric, which characteristics are depicted in FIG. 3. As shown in FIG. 3, the secondary emission ratio at the target's dielectric is plotted as a function of the energy level of the incident energy beam. In the range between zero volts and the "first crossover voltage", $E_{CR1}$ (typically 20–25 volts), the secondary emission ratio of the target's dielectric is less than unity; therefore, in this operating range, the number of primary electrons arriving at the dielectric surface exceeds the number of secondary electrons leaving, causing the surface to be charged in a negative direction.

If the electron beam energy is increased to the range between $E_{CR1}$ and the "second crossover voltage", $E_{CR2}$ (which may be several kilovolts), the target's dielectric exhibits a secondary emission ratio greater than unity. In this instance, the number of secondary electrons leaving the storage surface exceeds the number of primary electrons arriving, resulting in the storage surface becoming charged in a positive direction. To avoid space charge buildup during the positive charging of storage surface, secondary electrons are attracted to the +900 volt collector electrode 22 (see FIG. 1).

The writing of stored information occurs when the target's dielectric is charged in a positive direction, with a typical beam energy as indicated by point "A" on the curve of FIG. 3. Erasure takes place when the dielectric is charged in a negative direction, as represented by point "B". Normal reading is accomplished in region "C", where the electron beam energy level is negative at all points on the dielectric surface; hence, in the reading mode, the dielectric surface remains undisturbed by the reading beam.

Since the secondary emission characteristic operating points represented by A, B, and C, can be readily shifted by changing the electron gun cathode to storage surface voltage, a convenient means is available for controlling the functions performed by the tube.

Figure 2:
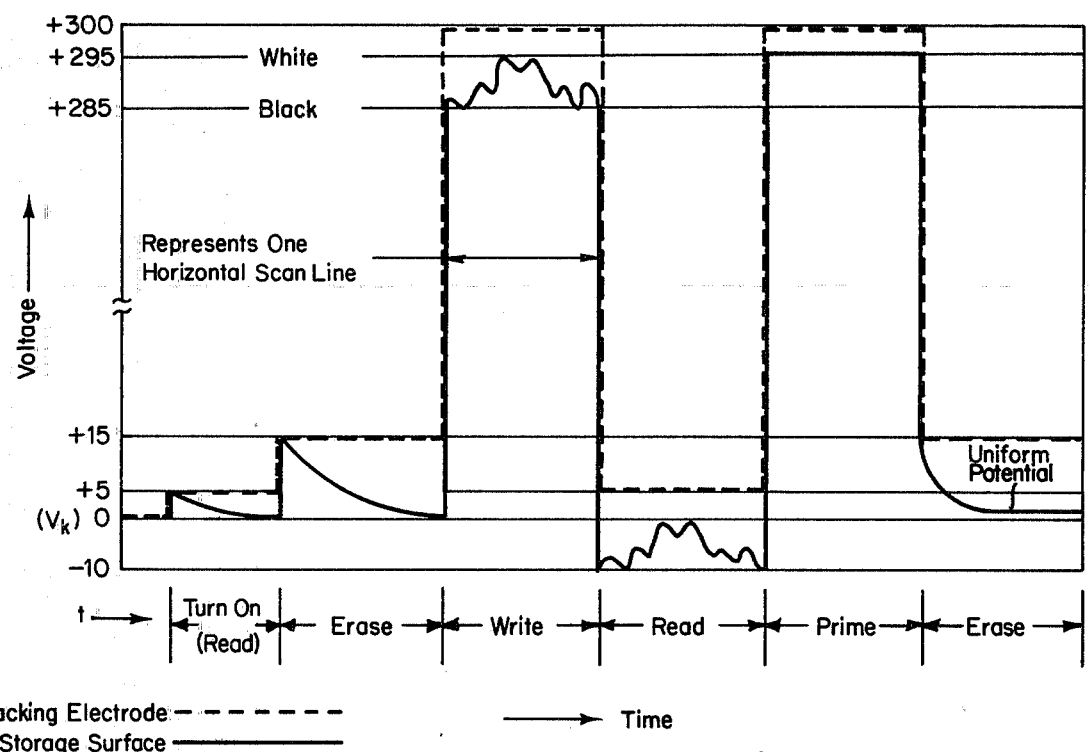
FIG. 2 is a diagram of voltage waveforms useful for explaining the operation of the scan converter tube shown in FIG. 1.

In its conventional configuration of the scan converter tube shown in FIG. 1 (without the feedback control incorporated in accordance with the subject invention) the cathode 30 is normally fixed at zero volts. Backing electrode voltages are +15, +300 and +5 volts for the erase, write and read modes, respectively; and a prime mode also uses +300 volts for the backing electrode or target conductor potential. It is noted that the prime mode is a two-step erase operation whereby the storage surface (following reading) is first primed, or fully written to a uniform white level by an unmodulated high voltage beam, after which the tube is switched to the normal erase mode and the storage surface is erased to a more uniformed black level. The charge phenomenon which takes place at the storage surface as a result of both mode switching, and electron beams scanning, is shown conceptually in FIG. 2 wherein the potential during the various operating modes of the backing electrode (target conductor) is indicated by the dashed lines and the potential at the storage surface (target's dielectric) is depicted by the solid lines.

In the embodiment of FIG. 1, it is assumed that the scan converter operates primarily in a TV raster type of scan with the electron beam being controlled by means of deflection yoke 16 in response to a pair of positioning signals $V_x$ and $V_y$ applied from a source of deflection signals (not shown). The input data signal is processed through a Write/Erase/Prime cathode control unit 32 and through a switch 34 to a cathode 30. The electron beam from electron gun 12 is focused by circuit 36 and coil 14; the collector potential $V_2$ is applied to element 22 from source 38 and the target voltage $V_1$ is applied to target 24 from a source 40. As shown in FIG. 1, various of the reference potentials sources are controlled in response to a mode status (MS) signal (applied from a mode control unit not shown) and in response thereto the sources apply the preselected voltage which is desired for each of the various operating modes, i.e. read, write, erase, or prime.

During all the operational modes except the read mode, the cathode 30 is controlled by unit 32 through switch 34 and the application of the input data signal and the application of bias potential (if any) is performed by unit 32 in accordance with procedures well known in the art.

However, in the read mode of operation the potential $V_k$ of cathode 30 is controlled by the output signal from feedback unit 42 in accordance with the principles of the subject invention. Also the output of feedback unit 42 may be applied as an input signal to grid control unit 44 such that the bias of the associated grid element may be adjusted for changes in cathode potential during the read mode. Grid control circuit 44 may be, for example, a conventional summing network in which the output voltage from unit 42 is added algebraically to the normal read bias for grid 46.

As explained hereinabove, in accordance with the subject invention, the performance, especially the reduction of shading, of the scan converter may be enhanced by charging the target dielectric over a wider range during the write mode, and automatically adjusting the cathode tube target conductor potential as a function of the charge level of each individual segment of the target's dielectric during the read mode. This is implemented in the embodiment shown in FIG. 1 by feedback unit 42 which senses the voltage drop across resistor 48 due to the target conductor current and in response thereto automatically and rapidly adjusts the cathode to target conductor potential.

Figure 7:
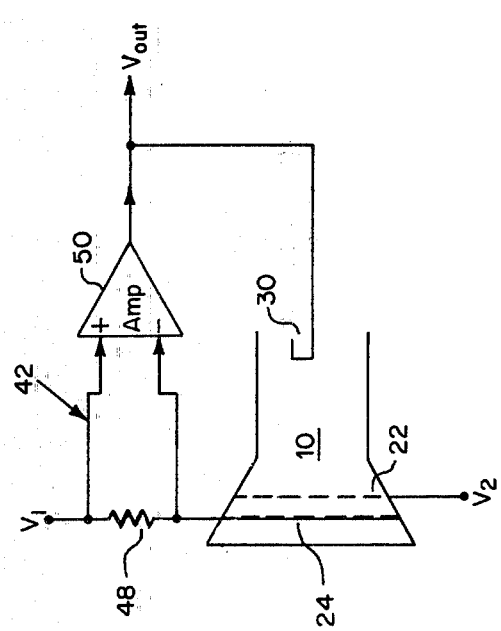

In FIG. 7, feedback unit 42 comprises a differential amplifier 50 having its input terminals coupled across resistor 48 and its output coupled to cathode 30. It is noted that the output voltage ($V_{out}$) from amplifier 50 is representative of variation in charge level of the different segments of target dielectric 26 and hence of the stored input data.

Figure 6:
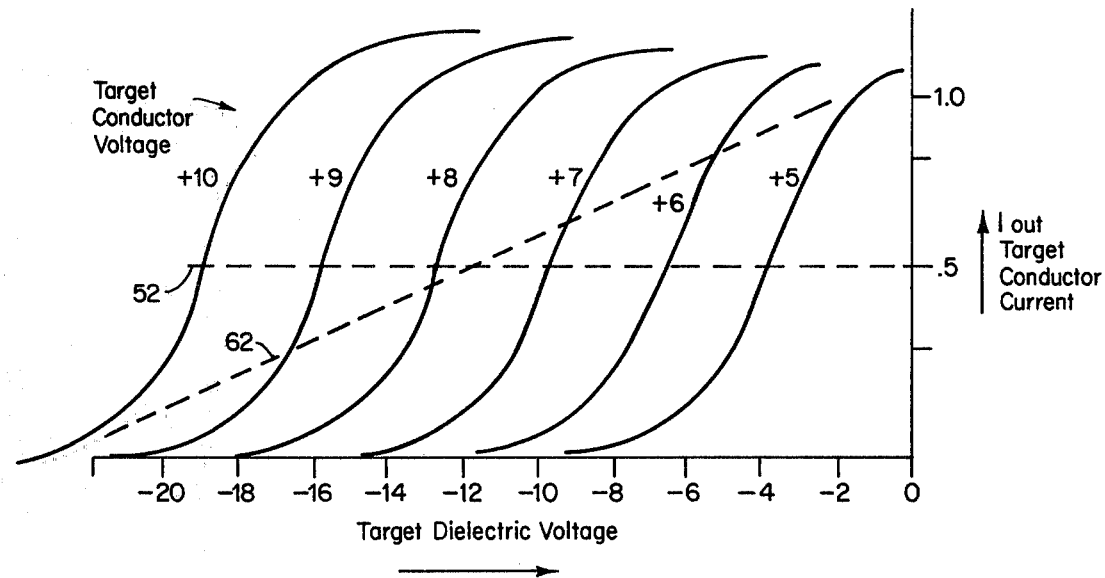
FIG. 6 is a diagram showing the read mode transfer characteristics of the scan converter tube of FIG. 1.

If the gain and bandwidth of amplifier 50 are extremely large, the read mode transfer function for the combination of scan converter tube 10 and feedback unit 42 would approximate a flat response, such as illustrated by line 52 in FIG. 6, e.g. the cathode to target conductor potential would be adjusted so as to cause a 50 percent output current for any value of charge level on the target dielectric. If it is assumed that the full current output is one microamp then the resultant output would be 0.5 microamp for the just described conditions. For example, assuming a target conductor bias of +6 volts and a dielectric charge level of a −7 volts, the output current would be 0.5 microamp; and if the adjacent incremental dielectric area were charged to a −10 volts, then the conductor current would tend to decrease with the result that feedback unit 42 would drive the cathode 30 (see FIG. 1) more negative. This feedback will in turn cause the output current to tend to increase and the result of this continued action is the target conductor to cathode bias being driven to a voltage, +7 volts in the instant case, where the output current will be maintained at 0.5 microamp and the system will at this point stabilize. Hence the operation of the combination of the scan converter tube 10 and feedback unit 42 is that of a classical negative feedback arrangement and any change in charge levels on the dielectric of the target can be shown to result in the potential of the cathode being driven until the loop is self-adjusted to the straight line transfer function 52 of FIG. 6. It should be noted that the principles of the subject invention are applicable to a wide range of charge levels on the target's dielectric and are not limited to the characteristics of any particular storage tube.

Figure 8:
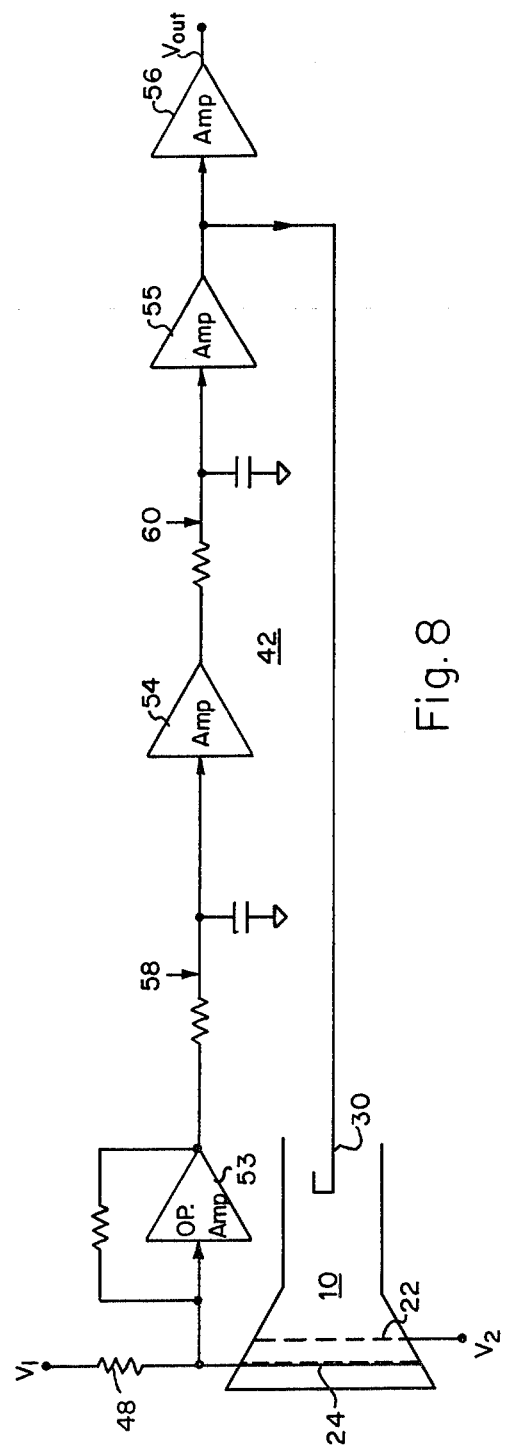

In a second configuration of the subject invention shown in FIG. 8, feedback unit 42 comprises amplifiers 53 through 55 with frequency tailoring networks 58 and 60 being coupled between amplifiers. For applications such as those associated with high speed television systems, the required video bandwidth is quite large and to insure systems stability the overall loop gain is normally limited due to the high gain, bandwidth products involved. For example, in the just mentioned TV applications a closed loop bandwidth of 6 megacycles may be required, and the transfer function identified by reference numeral 62 in FIG. 6 may be preferred to avoid stability problems. Generally, the departure from flat characteristic 52 to sloped characteristic 62 is effected by lowering the open loop gain of the system. However, the performance of the embodiment of FIG. 8 will still result in an excellent improvement in shading since the useful charging range of the target's dielectric is extended to encompass its full range.

For the system of FIG. 8, the feedback loop gain may be readily computed from the desired transfer characteristic 62 and the value of resistor 48. For example, from FIG. 6 it may be seen that for a cathode-to-target conductor potential of +6 volts the output current level is 0.75 microamps and for a cathode-to-target potential of +9 volts that the output current is 0.25 microamp; and so a 0.5 microamp change in target conductor current has to produce a 3 volt change in the potential between the cathode and the target conductor. Hence, for resistor 48 having a value of 50k ohms the required feedback gain "G" may be computed as follows:

$$G \times 0.5 \mu A \times 50k\Omega = 3 \text{ volts; or } G = 120$$

Figure 9:
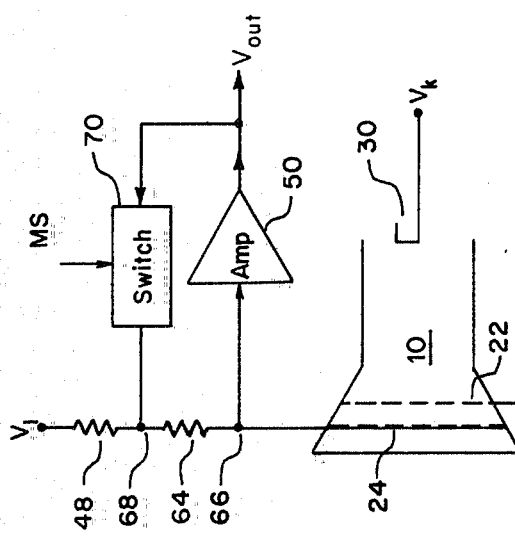

In the embodiment of FIG. 9, the potential of the cathode ($V_k$) is held constant and the feedback is implemented by sensing the current through resistors 48 and 64, amplifying the sensed signal and feeding it back to the junction point between the two resistors. In the "bootstrap" feedback arrangement of FIG. 9, a decrease in voltage at circuit junction 66 is amplified and fed back to junction point 68 so as to decrease the voltage thereof. Switch 70 responds to the mode control signal (MS) so that the output of amplifier 50 is coupled to junction point 68 only during the read mode of operation.

Figure 10:
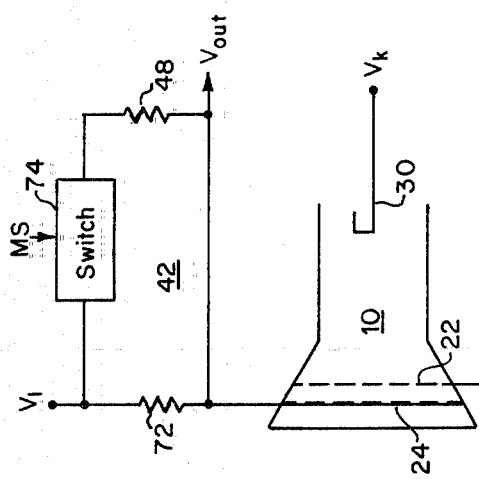

In the embodiment of FIG. 10, resistor 72 has a large value of resistance, e.g. 1 megohm and as a result thereof the target conductor potential increases as the conductor's current decreases; hence, automatically applying the correct polarity of feedback. As used herein, the term "a large value of resistance" is defined as that which will cause movement of the target to cathode potential over a range sufficient to read out an arbitrarily large dielectric charge. Switch 74 responds to the mode control signal (MS) so that resistor 72 is shunted by a much smaller value resistor 48, e.g. 50k ohms, during all operational modes except the read mode.

The embodiment of FIG. 11 is similar to that of FIG. 7, discussed hereinabove, except that the charge pattern on the target's dielectric is sensed from the current of collector element 22 by means of resistor 76. It is noted that in scan converter tubes, the target conductor and collector currents are complementary in the sense that read beam electrons not received by the target conductor are turned back to the collector element. Hence, the composite signal processing polarity of amplifiers 53' through 55' in FIG. 11 will be opposite from that of amplifiers 53 through 55 shown in FIG. 8.

The embodiment of FIG. 12 is similar to that of FIG. 9 explained hereinabove, except that the charge pattern on the target dielectric is sensed by means of the current from the collector element 22 and so amplifier 50 has the opposite polarity from that of amplifier 50' of FIG. 9.

In the embodiment of FIG. 13, tube 10' is a conventional direct view storage tube wherein a portion of the read beam passes through openings in target 24' (see FIG. 15) and information readout is directly presented on a phosphorous screen 15. As shown in FIGS. 14 and 15, target 24' comprises a grid structure having a metallic back surface 78 and a dielectric front surface 80 (target dielectric). However, since the phosphorous screen current is indicative of the stored charge pattern (stored input data), the operation of feedback unit 42 in the embodiment of FIG. 13 is identical to that described hereinabove relative to FIG. 8. Also, it is noted that in accordance with the principles of the subject invention, the feedback arrangements shown in FIGS. 7 through 12 are directly applicable to direct views storage tube applications. For example, the current from phosphorous screen 15 could be amplified and applied to the target conductor with such a polarity that as the sensed current tends to increase, the target conductor potential decreases.

Advantages resulting from the storage tube, feedback circuit combinations in accordance with the subject invention, include the following.

Substantially reduced shading as explained hereinabove.

Linearization of the transfer function of the storage tube. As shown in FIG. 6, the natural transfer function is "S" shaped typically with nonlinearity being 20 percent or more. Transfer function 52 of FIG. 6 yields extremely high linearity; while transfer function 62 results in about a four-time improvement in linearity.

Improvement in storage time. Since storage time is a function of gas ion discharge of the storage surface, the storage time can be increased by initially charging the surface to a higher value. The subject invention allows use of a significantly larger charging range during the writing process and so the storage time is improved. Typical improvement is from a natural storage time of 30 minutes to 2 to 3 hours for full grey scale images.

Improvement of zoom bleed down characteristics. This is an extension of the storage time improvement but for differing reasons. Zoom refers to the usual process used to magnify images stored on the scan converter target by shrinking the read raster on the target which results in the picture enlarging on an associated TV monitor. This process increases the current density reading the target in proportion to the decrease in read area. Therefore, a 4 to 1 zoom (linear zoom per side) results in a 16 to 1 increase in current density. Since the read electron beam contains a substantial range of electron energies, those having an equivalent voltage of a negative cathode cause erasure of stored information by charging it negatively. In accordance with the subject invention, the target has a substantially increased voltage charge to start with, and so longer time is required to effect this erasure. The increase in performance is typically a factor of from 5 to 50.

The output signal-to-noise ratio is also substantially improved by the subject invention. This results with the same beam current and appears to be a paradox; however, it can best be explained by assuming the signal-to-noise ratio is proportional to the product of read current and written dielectric charge. Improvements of 6 to 12 db have been achieved.

System stability is substantially increased by the subject invention. This is also a subtle but very important result which helps combat long term drift in cathode emission and makes possible longer time periods between adjustments. The basic factor is that in accordance with the subject invention the cathode-grid structure is electrically at the output of a feedback circuit. Well known feedback theory indicates that drift and unwanted noise effects are decreased by the gain of a feedback system. In a practical use of this effect, the grid cathode bias of a typical tube can be biased over a 20 to 50 volt range with negligible effect on output.

Thus, having disclosed new and useful feedback controlled storage tube devices,

What is claimed is:

1. In combination:
    a storage tube having a cathode, a target conductor element and a target dielectric surface and adapted for operating in a write mode of operation during which data is stored in the form of a charge pattern on said dielectric surface and for operating in a read mode of operation during which said charge pattern is sensed by means of a read electron beam so as to retrieve said stored data;
    feedback circuit means, responsive to the sensed level of stored charge on said target dielectric surface as data is read from said storage tube during said read mode, for producing an output signal indicative of said stored data; and
    switching means for operatively intercoupling, only during said read mode, said feedback circuit means with said storage tube, so that during said read mode the potential between said cathode and target conductor is continuously and automatically controlled as a function of the output signal from said feedback circuit means so as to allow readout of data written over a range of charge levels associated with a plurality of transfer characteristic curves of the target structure of said storage tube.

2. The combination of claim 1 wherein said storage tube is a scan converter type storage tube.

3. The combination of claim 1 wherein said storage tube is a direct view type storage tube.

4. The combination of claim 1 wherein said feedback circuit means includes means for sensing the current from said target conductor element, and amplifier means for amplifying the sensed current and applying, through said switching means, the amplified signal to said cathode with such a polarity that as the sensed current tends to decrease the cathode to target conductor potential is increased.

5. The combination of claim 1 wherein said amplifier means comprises a plurality of cascaded amplifier units and at least one filter circuit whose transfer function varies as a function of the frequency of the signals processed therethrough.

6. The combination of claim 1 wherein said feedback circuit means comprises means for sensing the current from said target conductor element, and amplifier means for amplifying the sensed current and applying, through said switching means, the amplified signal to said target conductor with such a polarity that as the sensed current tends to decrease the potential of said target conductor element is increased.

7. The combination of claim 1 wherein said feedback circuit means includes a resistor having a large resistance value and said switching means includes means for coupling said resistor to said target conductor such that a substantial proportion of said target conductor current flows through said resistor only during said read mode of operation.

8. The combination of claim 1 wherein said storage tube further comprises a collector element; and wherein said feedback circuit means includes means for sensing the current from said collector element, and amplifying means for amplifying the sensed current and applying, through said switching means, the amplified signal to said cathode with such a polarity that as the sensed current tends to increase the cathode to target conductor potential also increases.

9. The combination of claim 1 wherein said storage tube further comprises a collector element; and wherein said feedback circuit means includes means for sensing the current from said collector element, and amplifier means for amplifying the sensed current and applying, through said switching means, the amplified signal to said target conductor with such a polarity that as the sensed current tends to increase the target conductor potential also increases.

10. The combination of claim 1 wherein said storage tube further comprises a display screen; and wherein said feedback circuit means includes means for sensing the current from said display screen, and amplifier means for amplifying the sensed current and applying, through said switching means, the amplified signal to said cathode with such a polarity that as the sensed current tends to increase the cathode to target conductor potential decreases.

11. The combination of claim 1 wherein said storage tube further comprises a display screen; and wherein said feedback circuit means includes means for sensing the current from said display screen, and amplifier means for amplifying the sensed current and applying, through said switching means, the amplified signal to said target conductor with such a polarity that as the sensed current tends to increase the target conductor potential decreases.

12. A scan converter device which includes a scan converter tube having a target conductor, a target dielectric and a cathode, said device being adapted for storing applied data in the form of a charge pattern on said target dielectric during a write mode of operation and for reading out said data in response to a read electron beam during a read mode of operation, and wherein the improvement comprises:
  feedback circuit means, operatively intercoupled with said scan converter tube, for sensing the level of stored charge on said target dielectric as data is read from said storage tube during said read mode, and for automatically and continuously adjusting, during said read mode only, the potential between said cathode and target conductor as a function of the charge level currently being sensed so that the cathode to target conductor potential is increased or decreased as the sensed charge level increases or decreases, respectively; thereby enabling readout of data written over a range of charge levels associated with a plurality of transfer characteristic curves of the target structure of said scan converter tube.

13. The scan converter device of claim 12 wherein said feedback circuit means includes means for sensing the current from said target conductor and amplifier means for amplifying the sensed current and applying the amplified signal to said cathode with such a polarity that as the sensed current tends to decrease the cathode to target conductor potential is increased.

14. The scan converter device of claim 12 wherein said amplifier means comprises a plurality of cascaded amplifier units, and at least one filter circuit whose transfer function varies as a function of the frequency of the signals processed therethrough.

15. The scan converter device of claim 12 wherein said feedback circuit means comprises means for sensing the current from said target conductor element and amplifier means for amplifying the sensed current and applying the amplified signal to said target conductor with such a polarity that as the sensed current tends to decrease the potential of said target conductor element is increased.

16. The scan converter device of claim 12 wherein said feedback circuit means includes a resistor having a large resistance value and means for coupling said resistor to said tube such that a substantial portion of the target conductor current flows through said resistor only during the periods that data is read from said scan converter tube.

17. The scan converter device of claim 12 wherein said scan converter tube further comprises a collector element; and wherein said feedback circuit means includes means for sensing the current from said collector element, and amplifying means for amplifying the sensed current and applying the amplified signal to said cathode with such a polarity that as the sensed current tends to increase the cathode to target conductor potential also increases.

18. The scan converter device of claim 12 wherein said scan converter tube further comprises a collector element; and wherein said feedback circuit means includes means for sensing the current from said collector element and amplifier means for amplifying the sensed current and applying the amplified signal to said target conductor with such a polarity that as the sensed current tends to increase the target conductor potential also increases.

* * * * *